United States Patent
Fuller et al.

(10) Patent No.: US 6,350,640 B1
(45) Date of Patent: Feb. 26, 2002

(54) CMOS INTEGRATED CIRCUIT ARCHITECTURE INCORPORATING DEEP IMPLANTED EMITTER REGION TO FORM AUXILIARY BIPOLAR TRANSISTOR

(75) Inventors: Robert T. Fuller, Melbourne Beach; Chris McCarty, Melbourne; John T. Gasner, Satellite Beach; Michael D. Church, Sebastian, all of FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 08/276,290

(22) Filed: Jul. 18, 1994

(51) Int. Cl.[7] .......................................... H01L 21/8238
(52) U.S. Cl. ...................................... 438/202; 438/234
(58) Field of Search .................... 148/DIG. 9, DIG. 55; 438/202, 203, 204, 205, 225, 234

(56) References Cited

U.S. PATENT DOCUMENTS

| | | | |
|---|---|---|---|
| 5,017,996 A | 5/1991 | Hasuoka ..................... | 357/43 |
| 5,118,633 A | * 6/1992 | Sagara et al. ................. | 437/31 |
| 5,272,098 A | * 12/1993 | Smayling et al. ............. | 437/48 |

FOREIGN PATENT DOCUMENTS

| | | |
|---|---|---|
| EP | 0 139 266 A3 | 5/1985 |
| EP | 0 320 273 | 6/1989 |
| EP | 0 396 948 | 11/1990 |
| EP | 0 418 505 A2 | 3/1991 |

* cited by examiner

Primary Examiner—Tuan H. Nguyen
(74) Attorney, Agent, or Firm—Allen, Dyer, Doppelt, Milbrath & Gilchrist, P.A.

(57) ABSTRACT

To program a CMOS memory, an auxiliary bipolar transistor is formed in a P-well adjacent to the P-well of an NMOS device of the CMOS memory, the auxiliary transistor being capable of forcing a large magnitude current through a fusible link, so as to program the electronic state of the CMOS memory cell into a prescribed binary (1/0) condition. A separate implant mask for the emitter region of the auxiliary transistor allows the geometry and impurity concentration profile of the emitter region to be tailored by a deep dual implant, so that the impurity concentration of the emitter region is not decreased, and yields a reduced base width for the auxiliary transistor to provide a relatively large current gain to blow the fuse, while allowing the doping parameters of the source/drain regions of the CMOS structure to be separately established to prevent thyristor latch-up.

21 Claims, 4 Drawing Sheets

CMOS INTEGRATED CIRCUIT ARCHITECTURE INCORPORATING DEEP IMPLANTED EMITTER REGION TO FORM AUXILIARY BIPOLAR TRANSISTOR

FIELD OF THE INVENTION

The present invention relates in general to integrated circuit devices and is particularly directed to an improved complementary metal oxide semiconductor (CMOS) memory architecture, in which an auxiliary bipolar transistor structure is formed in a well region that is formed in common with that of a CMOS memory cell. The auxiliary bipolar transistor has an emitter region implanted separately from and with different physical characteristics than source and drain regions in the well region of the CMOS structure, so as to provide the auxiliary bipolar transistor with current gain sufficient to rupture a fusible link associated with the programming of the CMOS memory cell.

BACKGROUND OF THE INVENTION

Programmable CMOS memory architectures often employ a pattern of fusible material, such as thin layer of nichrome, which is associated with each of the cells of the array and is selectively ruptured or 'blown' to establish the binary state of the cell. To blow the link, it is customary practice to force a large magnitude current through the link, which melts a relatively narrow or constricted 'fuse' portion of the link, severing the link at that point, and thereby forcing the electronic state of the memory cell into a prescribed binary (1/0) condition.

A CMOS memory cell architecture in which an auxiliary bipolar transistor structure is provided for the purpose of supplying this large magnitude current is diagrammatically illustrated in FIG. 1 as comprising a semiconductor (e.g. N-type silicon) substrate 11 having a top surface 13, in respective first and second spaced portions 21 and 23 of which P-type well regions 31 and 33 are formed to a prescribed depth in substrate 11. The first P-well region 31 and adjacent N-type semiconductor material of the substrate serve as respective channels of an NMOS device 41 and a PMOS device 43 which, together, define a CMOS memory cell structure 40. To complete the CMOS device respective insulated gates 45 and 47 are formed on the surface of P-well 31 and an adjacent surface portion of N-substrate 11. Then, respective P+ source and drain regions 44 and 46 are introduced (implanted) into N-substrate 11 using gate 47 as a self-align mask. Similarly, N+ source and drain regions 48 and 49 are introduced (implanted) into P-well region 31 using gate 45 as a self-align mask. In the course of providing ohmic contacts to the respective source and drain regions of the CMOS structure, regions 46 and 48 may be bridged in common by a layer of interconnect.

To facilitate formation of the auxiliary bipolar transistor, the processing step (including mask) employed to implant the N+ source and drain regions 48 and 49 in P-well region 31 is also used to implant an N+ region 51 within P-well 33. N+ region serves as an N+ emitter region of the auxiliary transistor, shown at 50, transistor 50 being used to supply fusible link-rupturing current I, shown diagrammatically at 58, for programming the logical state of CMOS memory cell 40. The second P-well region 33 serves as the base region of transistor 50, and the underlying N-type substrate 11 serves as its collector.

In such a structure, as the packing density (lithographic line width resolution) increases, the separation between respective regions and associated PN junctions of the components of the CMOS memory cell (including the N+ emitter region 51 of the auxiliary bipolar transistor 50) decreases to the point that a parasitic thyristor device created between closely separated (PNP/NPN) regions at the surface of the substrate tends to latch up and thereby inhibit intended operation of the memory.

In order to reduce the likelihood of, and optimally prevent the occurrence of such a thyristor latch-up condition, the implant step through which the source/drain regions are formed may be tailored to reduce the impurity concentration of the source/drain regions and thereby reduce the current gain of the parasitic horizontal bipolar devices of which a respective thyristor is comprised. A drawback to this approach is the fact that reducing the implant doping concentration of the source/drain regions also reduces the doping concentration of the simultaneously formed emitter region, which reduces the current drive capability (current gain) of the auxiliary transistor to a such a low value as to effectively reduce its output current to less than that necessary to blow the fuse. (An alternative approach to eliminate the thyristor latch-up problem would be to simply increase the surface separation between regions of the architecture. An obvious, and impractical effect of increasing region separation, however, is that the intended integration density of the CMOS memory is reduced.)

SUMMARY OF THE INVENTION

In accordance with the present invention, the above described problems are solved by using a separate implant mask for the emitter region of the auxiliary transistor and controllably tailoring the geometry and impurity concentration profile of the emitter region, so that the auxiliary transistor has sufficient current gain to blow the fuse, while allowing the doping parameters of the source/drain regions of the CMOS structure to be separately established to maintain the intended integration density of the memory and prevent thyristor latch-up.

For this purpose, during the implantation of the source/drain regions form in the CMOS well region, the well region in which the auxiliary bipolar transistor is formed, is masked, so that no emitter region is formed in the well region used for the auxiliary bipolar transistor. Instead, once the source/drain regions have been formed in the well region of the CMOS device, a separate implant procedure is employed for introducing the emitter region into the well region of the auxiliary transistor. Specifically, a separate mask is used to implant the emitter region into the (bipolar base) well region of the auxiliary bipolar transistor. During this separate emitter formation step, the remainder of the substrate is masked, so that the emitter implant affects only the characteristics of the bipolar device.

Preferably, the emitter region is formed using two implants, in which a dopant of a conductivity type opposite to that of the bipolar well region is initially implanted at a relatively high energy level to a prescribed depth in the bipolar well region, followed by a second, reduced energy implant, which establishes the doping concentration of the emitter region in the vicinity of the surface of the bipolar well region, and produce a composite doping profile that optimizes the characteristics of the emitter region. Thus, the emitter region has a retrograde doping profile, with its highest concentration adjacent to the bottom of the bipolar well region. This retrograde profile, in combination with its increased depth (which results in a reduced vertical base width), yields an auxiliary bipolar structure having a current gain increased substantially with respect to that of the auxiliary bipolar transistor 50 of the structure of FIG. 1 and sufficient for programming the CMOS memory.

The architecture in which the present invention is employed may use either a planar process or a LOCOS process. In the latter case, where a bird's beak in the field oxide at the periphery of an aperture in the field oxide through which the emitter is implanted, it is necessary to employ a separate mask that has an implant aperture the edges of which are laterally offset from the periphery of the aperture in the field oxide. This lateral spacing confines the emitter region within the active area of the bipolar well region and so as to be sufficiently spaced from material of the substrate. Otherwise, if the emitter dimensions were to be defined by the field oxide aperture, radiation upon the thin bird's beak portion of the field oxide could initiate parasitic channel turn-on in that surface portion of the bipolar well region between the emitter region and the substrate.

DETAILED DESCRIPTION

As described briefly above, the invention successfully solves the problem of thyristor latch-up, without degrading the current generation capacity of the auxiliary bipolar transistor, by implanting the emitter region of the auxiliary transistor in a step that is separate and distinct from the formation of the source/drain regions into the well material used for both part of a CMOS structure and the base of the bipolar transistor. With this separate mask, the geometry and impurity concentration profile of the emitter region are controlled, so that the auxiliary bipolar transistor has sufficient current gain to blow the fuse, while allowing the doping parameters of the source/drain regions of the CMOS structure to be separately established to prevent thyristor latch-up.

The present invention will now be described with reference to FIGS. 2–5, which diagrammatically illustrate the manner in the process of manufacture of a CMOS memory cell architecture of the type shown in FIG. 1, described above, is modified so that emitter region of the auxiliary bipolar transistor has a geometry and doping profile that enables the auxiliary bipolar transistor to have a sufficiently high current gain, whereby its output drive current may be employed to selectively program a fusible link of the associated CMOS memory.

Figure 1:
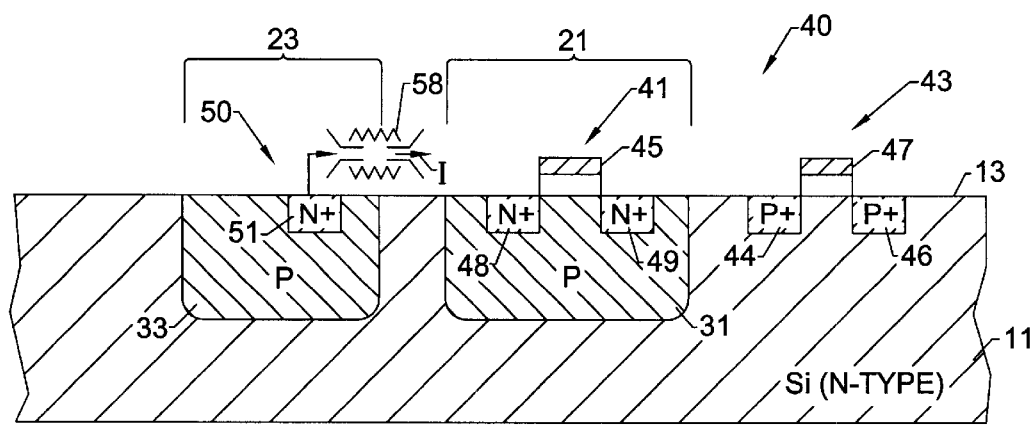
FIG. 1 diagrammatically illustrates a CMOS memory cell architecture in which an auxiliary bipolar transistor structure is provided for the purpose of supplying a large magnitude current for rupturing a programming fuse.
Figure 2:
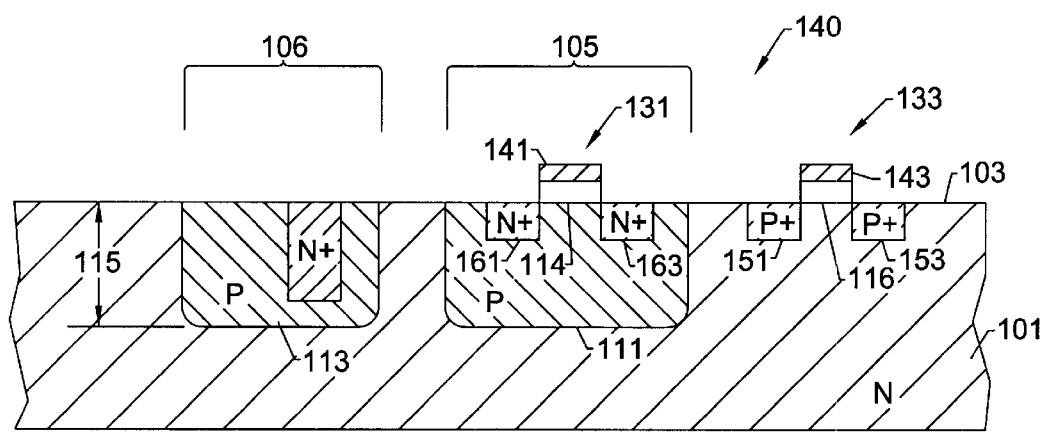
FIG. 2 diagrammatically illustrates an embodiment of a CMOS architecture having an improved auxiliary bipolar transistor structure in accordance with the present invention.

As shown in FIG. 2, just as in the CMOS architecture of FIG. 1, the CMOS architecture of the present invention is formed in a semiconductor (e.g. silicon) substrate 101 of a first conductivity type having a top surface 103, in respective first and second spaced portions 105 and 106 of which well regions 111 and 113 of a second conductivity type, opposite to the first conductivity type are formed to a prescribed depth 115 using a common mask layer. The architecture may either be that formed by a LOCOS (local oxidation of silicon) process or a planar (direct moat) process. For purposes of providing a non-limiting example, substrate 101 may be N-type and wells 111 and 113 P-type. It should be observed, however, that the conductivity types for these and other portions of the architecture described here may be reversed without departing from the invention.

Preferably, well regions 111 and 113 are formed by a dual implantation procedure, in which a suitable P-type dopant material, such as boron, is initially implanted at a relatively high energy level through respective apertures in the well mask layer which define the surface dimensions of well regions 111 and 113. This first relatively deep implant is followed by a second, reduced energy implant to establish the doping concentration closer to the surface of the well regions. As a result, each well region 111, 113 has what is conventionally known as a retrograde doping profile, with the greater concentration (effectively buried) in the vicinity of the bottom of the well than adjacent to the substrate surface.

As in the CMOS structure of FIG. 1, that portion of the first P-well region 111 and the adjacent N-type semiconductor material of the N-type substrate 101 adjacent to the top surface 103 serves as a channel of an NMOS device 131 and a PMOS device 133, respectively, of a CMOS memory cell structure 140. In the eventually completed CMOS structure 140, insulated gates (conductive gate material such as conductive polysilicon or metal overlying a thin oxide layer) 141 and 143 are formed on a surface portion 114 of P-well 111 and an adjacent surface portion 116 of N-substrate 101, prior to the (self-aligned) formation of source/drain regions of the CMOS device.

More particularly, respective P+ source and drain regions 151 and 153 of the PMOS device 133 are formed in substrate 101 by implanting P-type impurities (e.g., boron ions) using insulated gate 143 as a self-align mask. Similarly, N+ source and drain regions 161 and 163 are formed in P-well region 111 using gate 141 as a self-align mask to implant N-type impurities (e.g., phosphorus or arsenic ions). As noted earlier in connection with the discussion of the thyristor latch-up problem in the structure of FIG. 1, in a relatively narrow line width structure (e.g. less than one and a half microns), the implant step through which the N+ source/drain regions are formed in the P-well region (here source/drain regions 161, 163 formed in P-well region 111) employs a reduced energy level and irradiation window. As a result, the impurity concentration of the N+ source/drain regions of the NMOS device in P-well region 111 is sufficiently low that the current gain of its associated parasitic horizontal bipolar devices is comprised is inadequate to initiate thyristor latch-up.

Figure 3:
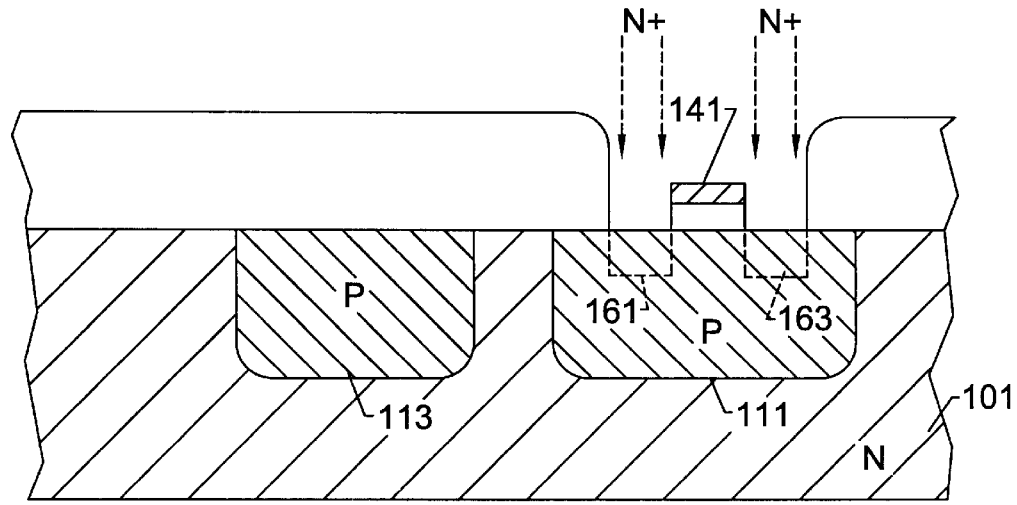
FIG. 3 shows the manner in which, during the implantation of source/drain regions in the CMOS well region, the auxiliary bipolar transistor well region is masked, so that no emitter region is formed in this well region.

In accordance with the present invention, during the implantation of source/drain regions 161 and 163, well region 113, in which the auxiliary bipolar transistor is formed, is masked, as shown in FIG. 3, so that during this step no emitter region is formed in well region 113. (Eventually, during metalization deposition and etch, regions 163 and 151 may be bridged by a layer of interconnect, as described above with reference to the CMOS structure of FIG. 1.)

Figure 4:
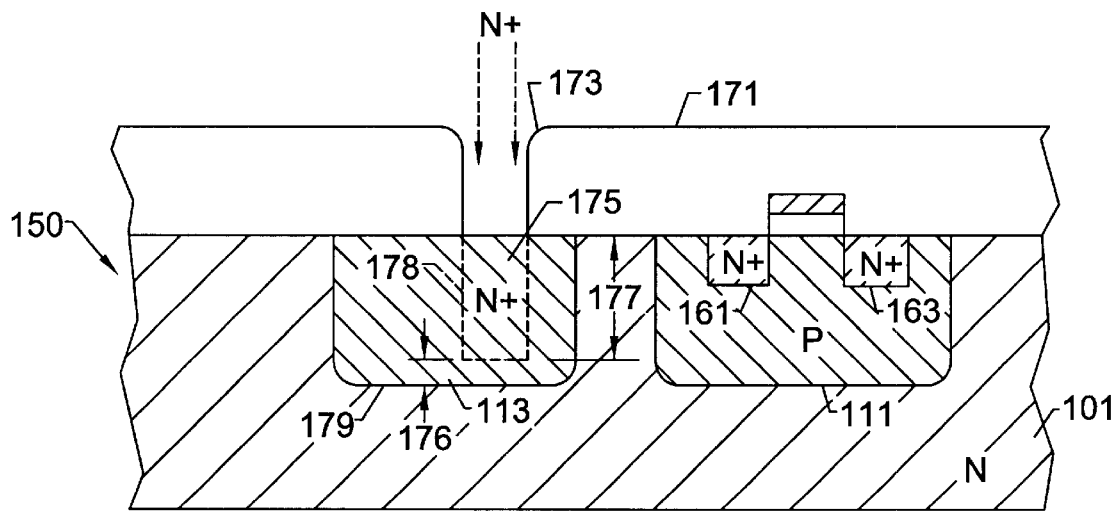
FIG. 4 shows the manner in which a separate implant procedure is employed for introducing the emitter region of the auxiliary transistor, using a separate mask.
Figure 5:
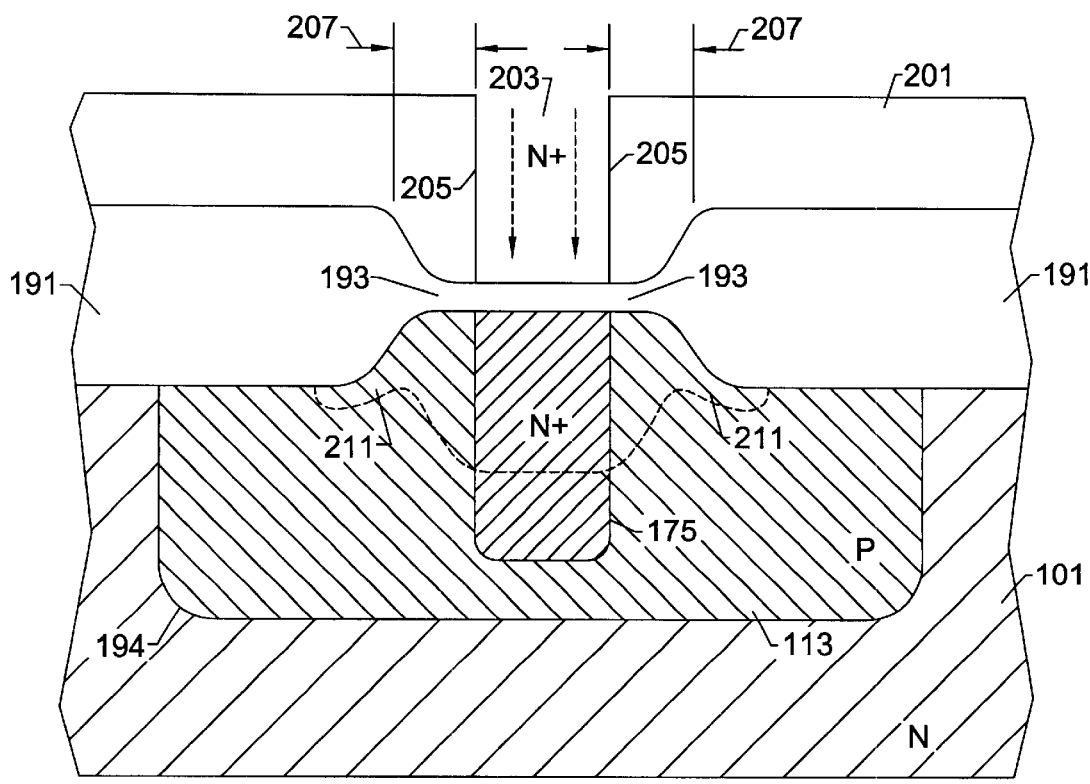
FIG. 5 diagrammatically illustrates a bird's beak of a LOCOS through which the emitter implant is formed, and the use of a separate mask having an implant aperture the sidewalls of which are laterally offset from the periphery of the aperture in the field oxide.

Instead, as shown in FIG. 4, once the N+ source/drain regions 161 and 163 have been formed in P-well region 113, a separate implant procedure is employed for introducing the emitter region of the auxiliary transistor. Specifically, a separate emitter implant mask 171 having an aperture 173 is used to implant the emitter region 175 of an auxiliary transistor 150 in P-well region 113. During emitter implant, the remainder of the surface 103 of the substrate 101 is masked, so that the emitter implant affects only the characteristics of the bipolar device. Preferably, emitter region 175 is formed using two N+ implants, in which an N-type dopant material, such as phosphorus or arsenic, is initially implanted at a relatively high energy level to a prescribed depth 177 in P-well region 113, followed by a second, reduced energy implant to establish the doping concentration of the emitter region in the vicinity of the surface 103 of P-well region 113. As a result of the first elevated energy N+ implant, the PN junction between emitter region 175 and well region 113 is considerably deeper than those of N+ source/drain regions 161 and 163 of NMOS device in P-well region 111 and, consequently, deeper than the depth of emitter region 51 in the P-well region 33 of the structure shown in FIG. 1.

Figure 6:
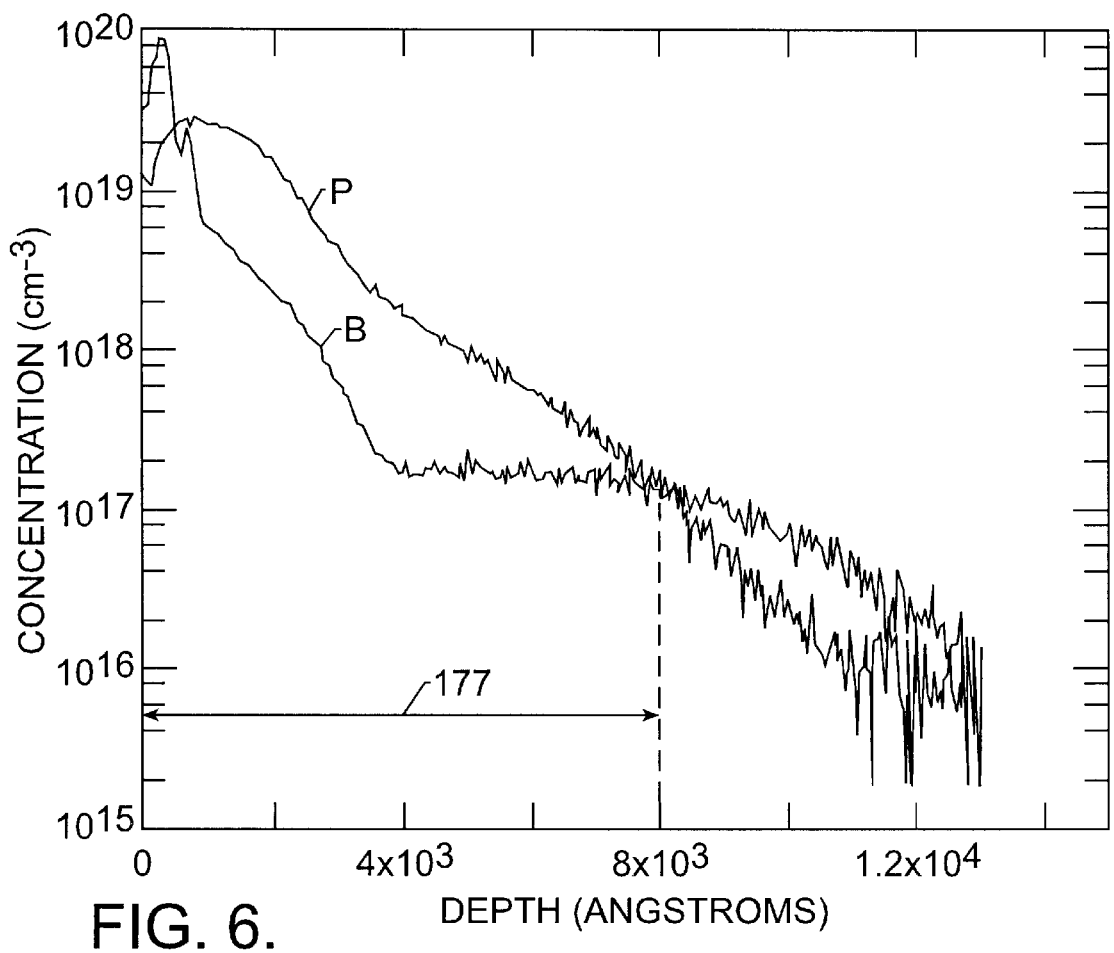
FIG. 6 shows a non-limiting plot of an exemplary impurity concentration profile resulting from P-type and N-type implants in the substrate for forming the P-well and the deep emitter region in the P-well (base region) of the auxiliary bipolar transistor of the present invention.

FIG. 6 shows a non-limiting plot of an exemplary impurity concentration profile resulting from P-type and N-type implants in the substrate 101, for forming the P-well 113 and the deep emitter region 175 in the P-well (base region) of the auxiliary bipolar transistor structure. Specifically, FIG. 6 shows a plot of impurity concentration (in $cm^{-3}$) vs. depth (in Angstroms) from the top surface of the N-type substrate of respective boron (P-type impurity) and phosphorus (N-type impurity) implants of the structure of the present invention, diagrammatically shown in FIG. 4. As illustrated, in that area of the P-well 113 exposed by implant aperture 173, the zone of the (N-type) phosphorus (P) curve dominates the B (boron) implant, so that the depth 177 of N+ emitter region 175 extends to a location at which the P and B impurity concentrations match, delineated by the broken line, corresponding to emitter depth 177. Below the bottom of the emitter region 175, the phosphorus impurity dominates the boron implant, so that the well 113 is P-type beneath the bottom of the emitter region 175, corresponding to the prescribed base width 176.

As pointed out above, the increase in the depth of emitter region 175 results in an auxiliary bipolar structure 150 having a modified geometry in the form of a reduced base width, the base width 176 being defined between an emitter base junction 178 at the bottom 179 of the emitter region 175 and the underlying N-type substrate, compared with that of the conventional auxiliary bipolar structure 50 of FIG. 1. As a consequence of this reduced base width, the gain of bipolar transistor 150 is increased considerably with respect to that of transistor 50 of FIG. 1. Indeed, because of the relatively low energy used to implant the N+ source/drain regions and N+ emitter regions of the architecture of FIG. 1, resulting in a relatively shallow emitter region 51, the current gain of transistor 50 may be as low a single digit value (e.g. on the order of a value of five). On the other hand, the current gain of transistor 150 of the architecture of FIG. 2 may be on the order of 40–50, which is sufficiently high to provide the necessary drive current for blowing the programming fuse link for the CMOS memory device.

Since the first N-type high energy implant for emitter region 175 is followed by a second, reduced energy, N-type implant, the resulting composite doping profile of the emitter region 175 has a retrograde characteristic, with its largest concentration in the vicinity of bottom of the emitter-base junction 178 adjacent to the bottom of P-well 113, than at the substrate surface. This retrograde profile, in combination with its increased depth (which results in a reduced base width), yields an auxiliary bipolar structure that has the necessary current gain for programming memory.

As described previously, the architecture in which the present invention is employed may use either a planar process or a LOCOS process. In the latter case, as diagrammatically illustrated in FIG. 5, where a field oxide 191 is grown on the surface of the substrate, the field oxide typically has a bird's beak or reduced thickness portion 193 adjacent to the PN junction 194 between P-well 113 and substrate 101. Even though the depth of the implant of the emitter region 175 is such that the base width of the bipolar device is defined between the bottom of emitter region and the bottom of the P-well region 113, because of the relatively close lateral spacing between the edge of bird's beak 193 and substrate 101, there is a potential for lateral parasitic field effect turn-on in the presence of incident radiation underneath the relatively thin bird's beak portion of the field oxide.

To avoid this problem, when implanting the emitter region, rather than simply use the field oxide as a self-align implant mask for the emitter region, it is preferable to employ a separate mask 201 that has an implant aperture 203, the edges or sidewalls 205 of which are laterally offset from the bird's beak portion 193 of the field oxide 191. This lateral spacing, shown at 207, brings the dimensions of the implanted N+ emitter region 175 adequately within the active area of the P-well region 113 and sufficiently spaced from the N-type material of the substrate 101. Otherwise, if the emitter dimensions were to be defined by the field oxide aperture, radiation through the thin bird's beak portion 193 of the field oxide 191 could initiate parasitic channel turn-on in a surface portion 211 of the well region 113 between the emitter region 175 and the substrate 101. As a non-limiting example of a range of emitter implant dosage parameters, an implant energy in a range of 145–195 KeV may be used to obtain an emitter region implant dosage in a range of $1.5 \times 10^{15}$ to $8 \times 10^{15}$ ions/$cm^2$.

EXAMPLE

Figure 7:
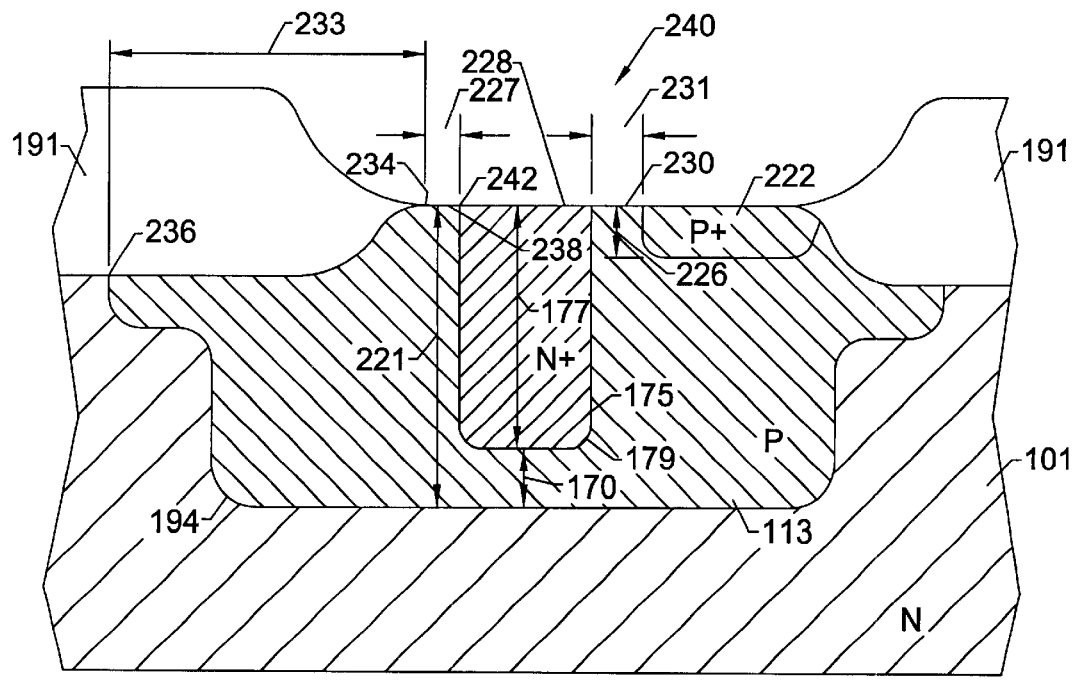
FIG. 7 diagrammatically illustrates an auxiliary bipolar transistor structure obtained by the processing sequence described above with reference to FIG. 5, and showing respective dimensions of the respective regions of the auxiliary transistor.

FIG. 7 diagrammatically illustrates an auxiliary bipolar transistor structure obtained by the processing sequence described above with reference to FIG. 5, and showing respective dimensions of the respective regions of the auxiliary transistor. The implanted P-well region 113 may be formed to a depth 221 on the order of 1.0 to 1.6 microns, and the emitter region 175 may be formed to a depth 177 on the order of 0.6 to 1.0 microns from the surface 228 of the well region 113 within the aperture 240 through the field oxide 191, leaving a base width 176 on the order of 0.4 to 0.6 microns. A P+ base contact 222 may be formed to a depth 226 on the order of 0.25 to 0.5 microns, and may be spaced laterally from the emitter region 175 by a surface portion 230 of the surface 228 within the aperture 240 through the field oxide 191. The lateral spacing 231 of the surface portion 230 between emitter region 175 and base region 222 is on the order of 0.5 to 1.0 microns. The spacing 233 of the edge 234 of the aperture 240 through the field oxide 191 to the lateral edge 236 of the P-well 113 may be on the order of 1.0 to 2.2 microns, and the spacing 227 of a surface portion 238 of the surface 228 within the field oxide aperture 240 from the edge 234 of the aperture 240 to the edge 242 of the emitter region 175 may be on the order of 0.4 to 0.6 microns.

As will be appreciated from the foregoing description, the above described conflicting problems of thyristor latch-up and the need for adequate bipolar current gain are solved in accordance with the present invention by using a separate implant mask for the emitter region of the auxiliary transistor. This allows the geometry and impurity concentration profile of the emitter region to be tailored by a deep dual implant, so that not only is the impurity concentration of the emitter region not degraded, but yields a reduced base width for the auxiliary transistor to provide sufficient current gain to blow the fuse, while allowing the doping parameters of the source/drain regions of the CMOS structure to be separately established (to prevent thyristor latch-up).

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A method of manufacturing a semiconductor architecture comprising the steps of:
   (a) providing a semiconductor substrate of a first conductivity type having a first surface;
   (b) forming, to a first depth from said first surface in respective first and second spaced-apart portions of said semiconductor substrate, first and second well regions of second conductivity type;
   (c) forming first source and drain regions of said first conductivity type of a first channel conductivity type MOS structure in spaced apart surface portions of said first doping and a second depth from said first surface, less than said first depth; and
   (d) forming an emitter region of said first conductivity type of a bipolar transistor structure in said second well region, said second well region forming the base region of said bipolar transistor structure and said substrate forming the collector region of said bipolar transistor structure, such that said emitter region has a second doping greater than that of said first source and drain regions, and a third depth from said first surface deeper than said second depth of said first source and drain regions said first MOS structure, wherein
   step (c) comprises selectively masking said first surface of said substrate so as to provide first and second impurity introduction apertures overlying said first well region, and introducing impurities of said first conductivity type at a first dosage energy to said second depth in said first well region, and wherein
   step (d) comprises selectively masking said first surface of said substrate so as to provide a third impurity introduction aperture overlying said second well region, introducing impurities of said first conductivity type at a third dosage energy to a fourth depth less than said third depth in said second well region.

2. A method according to claim 1, further including the step (e) of forming second source and drain regions of said second type of a second channel conductivity type MOS structure in spaced apart surface portions of said substrate adjacent to said first well region in which said first channel conductivity type MOS structure is formed.

3. A method of manufacturing a semiconductor architecture having a programmable CMOS memory cell structure comprising the steps of:
   (a) forming to a first depth from a first surface in respective first and second spaced-apart portions of a semiconductor substrate of a first conductivity type;
   (b) forming a first channel conductivity type MOS structure in said first well region by forming first source and drain regions of said first conductivity type in spaced apart surface portions of said first well region, said first source and drain regions having a first doping and a second depth from said first surface, less than said first depth;
   (c) forming a bipolar transistor structure having an emitter region, a base region and a collector region, in said second spaced-apart portion of said substrate including said second well region forming said base region and said substrate forming said collector region, such that said emitter region has a second doping greater than that of said first source and drain regions, and a third depth from said first surface deeper than said second depth of said first source and drain regions said first MOS structure;
   (d) forming a second channel conductivity type MOS structure in said substrate by forming second source and drain regions of said second type in spaced apart surface portions of said substrate adjacent to said first well region in which said first channel conductivity type MOS structure is formed, and interconnecting said second MOS structure with said first MOS device, so as to form said CMOS memory cell; and
   (e) providing a fusible link which interconnects said bipolar transistor structure with said CMOS memory cell, whereby selective operation of said bipolar transistor structure supplies current to said fusible link, so as to program said CMOS memory cell into a prescribed binary state, wherein
   step (b) comprises selectively masking said first surface of said substrate so as to provide first and second impurity introduction apertures overlying said first well region, and introducing impurities of said first conductivity type at a first dosage energy to said second depth in said first well region, and wherein
   step (c) comprises selectively masking said first surface of said substrate so as to provide a third impurity introduction aperture overlying said second well region, introducing impurities of said first conductivity type at a second dosage energy to said third depth in said second well region, and introducing impurities of said first conductivity type at a third dosage energy to a fourth depth less than said third depth in second well region.

4. A method according to claim 3, wherein said third impurity introduction aperture is offset from the periphery of an aperture in a field oxide on the surface of said substrate through which the emitter is formed, so as to be sufficiently spaced from the substrate to prevent radiation upon said field oxide from initiating parasitic channel turn-on in that surface portion of said second well region between said emitter region and said substrate.

5. A method of manufacturing a semiconductor architecture comprising the steps of:

(a) forming, in respective first and second spaced-apart portions of a semiconductor substrate of a first conductivity type, first and second well regions of a second conductivity to a first depth from a first surface of said substrate;

(b) forming a first channel conductivity type MOS structure in said first well region by introducing first source and drain regions of said first conductivity type in spaced apart surface portions of said first well region, said first source and drain regions having a first doping and a second depth from said first surface, less than said first depth;

(c) forming, in said second spaced-apart portion of said substrate including said second well region, a bipolar transistor structure having an emitter region of said first conductivity type, a base region of said second conductivity type and a collector region of said first conductivity type, such that said second well region forms said base region and said substrate forms said collector region, said emitter region having a second doping greater than that of said first source and drain regions, and a third depth from said first surface deeper than said second depth of said first source and drain regions of said first channel conductivity type MOS structure;

(d) forming, in a third portion of said substrate spaced apart from said first and second surface portions of said substrate, a second channel conductivity type MOS structure by introducing second source and drain regions of said second type in spaced apart surface portions of said third portion of said substrate adjacent to said first well region containing said first channel conductivity type MOS structure, and interconnecting said second MOS structure with said first MOS device, so as to form a CMOS device therewith;

(e) forming a fusible link which interconnects said bipolar transistor structure with said CMOS device, whereby selective operation of said bipolar transistor structure supplies current to said fusible link;

(f) performing local oxidation of the surface of said substrate to form a field oxide having an aperture therethrough overlying said second well region, such that a first 'bird's beak' edge of said aperture through said field oxide is spaced apart from said emitter region by a first surface portion of said second well region therebetween; and (g) forming a base contact region in said base region so as to be spaced apart from said emitter region by a second surface portion of said second well region.

6. A method according to claim 5, wherein said first 'bird's beak' edge of said aperture through said field oxide formed on said substrate is spaced apart from said emitter region by a distance sufficient to prevent radiation incident upon said field oxide from initiating parasitic channel turn-on in 1 surface portion of said second well region between said emitter region and said substrate.

7. A method of manufacturing a semiconductor architecture comprising the steps of:

(a) forming, in respective first and second spaced-apart portions of a semiconductor substrate of a first conductivity type, first and second well regions of a second conductivity to a first depth from a first surface of said substrate;

(b) forming a first channel conductivity type MOS structure formed in said first well region by introducing first source and drain regions of said first conductivity type in spaced apart surface portions of said first well region, such that said first source and drain regions have a first doping and a second depth from said first surface, less than said first depth;

(c) forming, in said second spaced-apart portion of said substrate including said second well region, a bipolar transistor structure having an emitter region of said first conductivity type, a base region of said second conductivity type and a collector region of said first conductivity type, such that said second well region forms said base region and said substrate forms said collector region;

(d) forming a second channel conductivity type MOS structure formed in said substrate by introducing second source and drain regions of said second type in spaced apart surface portions of said substrate adjacent to said first well region containing said first channel conductivity type MOS structure; and (e) performing local oxidation of on the surface of said substrate to form a field oxide having an aperture therethrough overlying said second well region, such that a first 'bird's beak' edge of said aperture through said field oxide is spaced apart from said emitter region by a distance sufficient to prevent radiation incident upon said field oxide from initiating parasitic channel turn-on in surface portion of said second well region between said emitter region and said substrate.

8. A method according to claim 7, wherein step (c) includes forming a base contact region in said base region so as to be spaced apart from said emitter region by a second surface portion of said second well region within the confines of said aperture through said field oxide.

9. A method according to claim 7, wherein step (c) comprises forming said emitter region to have a second doping greater than that of said first source and drain regions.

10. A method according to claim 7, further including the step of (f) interconnecting said second MOS structure with said first NOS device, so as to form a CMOS device.

11. A method according to claim 7, wherein step (c) comprises introducing said emitter region to a third depth from said first surface deeper than said second depth of said first source and drain regions of said first channel conductivity type MOS structure.

12. A method of manufacturing a semiconductor architecture comprising the steps of:

(a) forming, in respective first and second spaced-apart portions of a semiconductor substrate of a first conductivity type, first and second well regions of a second conductivity to a first depth from a first surface of said substrate;

(b) forming a first channel conductivity type MOS structure formed in said first well region by introducing first source and drain regions of said first conductivity type in spaced apart surface portions of said first well region, such that said first source and drain regions have a first doping and a second depth from said first surface, less than said first depth;

(c) forming, in second spaced-apart portion of said substrate including said second well region, a bipolar transistor structure having an emitter region of said first conductivity type, a base region of said second conductivity type and a collector region of said first conductivity type, such that said second well region forms said base region and said substrate forms said collector region, and forming a base contact region in said base region spaced apart from said emitter region by a first surface portion of said second well region;

(d) forming a second channel conductivity type MOS structure formed in said substrate by introducing second source and drain regions of said second type in spaced apart surface portions of said substrate adjacent to said first well region containing said first channel conductivity type MOS structure; and (e) performing local oxidation of the surface of said substrate a to form field oxide having an aperture therethrough overlying said second well region, such that said field oxide does not overlie said first surface portion of said second well region between said emitter region and said base contact region.

13. A method according to claim 12, wherein step (c) comprises forming said emitter region to have a second doping greater than that of said first source and drain regions.

14. A method according to claim 12, further including the step of (f) interconnecting said second MOS structure with said first MOS device, so as to form a CMOS device.

15. A method according to claim 12, wherein step (c) comprises introducing said emitter region to a third depth from said first surface deeper than said second depth of said first source and drain regions of said first channel conductivity type MOS structure.

16. A method according to claim 12, wherein said field oxide is formed on said surface of said substrate such that a first 'bird's beak' edge of said aperture through said field oxide is spaced apart from said emitter region by a distance sufficient to prevent radiation incident upon said field oxide from initiating parasitic channel turn-on in a surface portion of said second well region between said emitter region and said substrate.

17. A method of manufacturing a semiconductor architecture comprising the steps of:

(a) forming, in respective first and second spaced-apart portions of a semiconductor substrate of a first conductivity type, first and second well regions of a second conductivity type to a first depth from a first surface of said semiconductor substrate;

(b) forming an MOS structure having a channel of said first conductivity type in said first well region by introducing source and drain regions of said first conductivity type in spaced apart surface portions of said first well region, said source and drain regions having a first doping and a second depth from said first surface, less than said first depth;

(c) forming, in said second spaced-apart portion of said substrate including said second well region, a bipolar transistor structure having an emitter region of said first conductivity type, a base region of said second conductivity type and a collector region of said first conductivity type, such that said second well region forms said base region and said substrate forms said collector region, said emitter region having a second doping greater than that of said source and drain regions, and a third depth from said first surface deeper than said second depth of said source and drain regions of said MOS structure;

(d) performing local oxidation of the surface of said substrate to form a field oxide having an aperture therethrough overlying said second well region, such that a first 'bird's beak' edge of said aperture through said field oxide is spaced apart from said emitter region by a first surface portion of said second well region therebetween; and (e) forming a base contact region in said base region so as to be spaced apart from said emitter region by a second surface portion of said second well region.

18. A method according to claim 17, wherein said first edge of said aperture through said field oxide formed on said substrate is spaced apart from said emitter region by a distance sufficient to prevent radiation incident upon said field oxide form initiating parasitic channel turn-on in a surface portion of said second well region between said emitter region and said substrate.

19. A method of manufacturing a semiconductor architecture comprising the steps of:

(a) forming, in a first surface portion of a semiconductor substrate of a first conductivity type, a well region of a second conductivity type to a first depth from a first surface of said semiconductor substrate;

(b) forming, in a second surface portion of said semiconductor substrate, spaced apart from said first surface portion thereof, an MOS structure having a channel of said first conductivity type, by introducing source and drain regions of said second conductivity type in spaced apart surface portions of said second surface portion, said first source and drain regions having a first doping and a second depth from said first surface, less than said first depth;

(c) forming, in said second surface portion of said substrate including said well region, a bipolar transistor structure having an emitter region of said first conductivity type, a base region of said second conductivity type and a collector region of said first conductivity type, such that said well region forms said base region and said substrate forms said collector region, said emitter region having a second doping greater than that of said source and drain regions, and a third depth from said first surface deeper than said second depth of said source and drain regions of said MOS structure;

(d) performing local oxidation of the surface of said substrate to form a field oxide having an aperture therethrough overlying said second well region, such that a first 'bird's beak' edge of said aperture through said field oxide is spaced apart from said emitter region by a first surface portion of said second well region therebetween; and (e) forming a base contact region in said base region so as to be spaced apart from said emitter region by a second surface portion of said second well region.

20. A method according to claim 19, wherein said first 'bird's beak' edge of said aperture through said field oxide formed on said substrate is spaced apart from said emitter region by a distance sufficient to prevent radiation incident upon said field oxide form initiating parasitic channel turn-on in a surface portion of said second well region between said emitter region and said substrate.

21. A method according to claim 19, further comprising the step of:

(f) forming a fusible link which interconnects said bipolar transistor structure with said MOS structure, whereby selective operation of said bipolar transistor structure supplies current to said fusible link.

* * * * *

UNITED STATES PATENT AND TRADEMARK OFFICE
CERTIFICATE OF CORRECTION

PATENT NO. : 6,350,640 B1
DATED : February 26, 2002
INVENTOR(S) : Robert T. Fuller, Chris McCarty, John T. Gasner and Michael D. Church It is certified that error appears in the above-identified patent and that said Letters Patent is hereby corrected as shown below:

Column 1,
Line 1, delete "CM OS" insert -- CMOS --
Line 23, delete "as thin" insert -- as a thin --

Column 2,
Line 18, delete "to a such" insert -- to such --

Column 4,
Line 66, delete "is comprised"

Column 8,
Line 23, after "second well region" insert -- by forming said emitter region of said first conductivity type in said second well region, said second well region --

Column 10,
Line 40, delete "NOS" insert -- MOS --

Signed and Sealed this

Third Day of September, 2002

Attest:

JAMES E. ROGAN
*Attesting Officer*   *Director of the United States Patent and Trademark Office*